United States Patent [19]

Stahlhofen

[11] 4,160,671
[45] Jul. 10, 1979

[54] PHOTOSENSITIVE COMPOSITION

[75] Inventor: Paul Stahlhofen, Wiesbaden, Fed. Rep. of Germany

[73] Assignee: Hoechst Aktiengesellschaft, Fed. Rep. of Germany

[21] Appl. No.: 831,935

[22] Filed: Sep. 9, 1977

[30] Foreign Application Priority Data

Sep. 13, 1976 [DE] Fed. Rep. of Germany ....... 2641100

[51] Int. Cl.² ............................................... G03C 1/52
[52] U.S. Cl. ..................................................... 96/91 D
[58] Field of Search ........................................ 96/91 D

[56] References Cited

U.S. PATENT DOCUMENTS

| | | | |
|---|---|---|---|
| 3,046,110 | 7/1962 | Schmidt | 96/91 D |
| 3,046,115 | 7/1962 | Schmidt et al. | 96/91 D |
| 3,046,116 | 7/1962 | Schmidt | 96/91 D |
| 3,632,344 | 1/1972 | Moraw et al. | 96/91 R |
| 3,775,113 | 11/1973 | Bonham et al. | 96/91 D |
| 3,779,761 | 12/1973 | Dustin | 96/91 D |
| 4,009,033 | 2/1977 | Bakos et al. | 96/91 D |

FOREIGN PATENT DOCUMENTS

1555473  12/1968  France ..................... 96/91 D

*Primary Examiner*—Mary F. Kelley
*Attorney, Agent, or Firm*—James E. Bryan

[57] ABSTRACT

This invention relates to a photosensitive composition comprising an ester or an amide of an o-naphthoquinone diazide sulfonic or carboxylic acid and, based on the amount of this compound, about 1 to 50 per cent by weight of an organic dye capable of salt formation and about 5 to 75 per cent by weight of a photosensitive halogen-containing compound which releases acid upon exposure to light and having one of the general formulae I or II

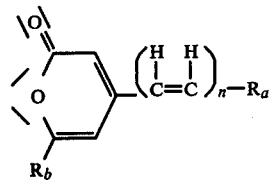

I

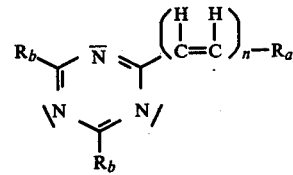

II in which $R_a$ is an aryl group or a heterocyclic group which may be substituted, $R_b$ is a trihaloalkyl group or a trihaloalkenyl group having from 1 to 3 carbon atoms, and n is 1, 2 or 3.

6 Claims, No Drawings

PHOTOSENSITIVE COMPOSITION

This invention relates to a photosensitive composition which contains an o-naphthoquinone diazide compound as the photosensitive substance, as well as a photosensitive acid-releasing, halogen-containing compound and a dye and which yields a clearly visible image corresponding to the original immediately after exposure to light.

From German Pat. Nos. 854,890, and 938,233, it is, e.g., known to use naphthoquinone-(1,2)-diazide compounds as photosensitive substances for the production of presensitized printing plates. However, such sensitized layers have the disadvantage that the yellow naphthoquinone-(1,2)-diazide layers bleach upon exposure to light to give a faded, yellow light decomposition product, with the result that the layer portions not decomposed by the light (image areas) can be distinguished only with difficulty from the light decomposition products (non-image areas). In practice, this very often leads to defective copies, particularly upon exposure in the so-called step-and-repeat copying machines where one diapositive only is projected several times side by side on the printing plate, e.g., when printing labels. Because the contrast between the image and non-image areas on the printing plate after exposure is poor, particularly when viewed in yellow light, as is necessary in copying rooms for processing photosensitive printing plates, it may, e.g., be very difficult to carry out exact and space-saving registering work.

It already has been proposed to alleviate this drawback, e.g., by the addition of a colored organic indicator dye in homogeneous distribution to the photosensitive layer, which dye changes its color in the pH range between 2.5 and 6.5 (compare German Offenlegungsschrift No. 1,447,011). In U.S. Pat. No. 3,669,658, a different method is disclosed in which o-quinone diazides or naphthoquinone diazides with a leuco dye yield after exposure, a colored image in the exposed areas. However, these layers have the disadvantage that the obtainable image contrast is insufficient in many cases in practice and that it disappears again upon subsequent development.

In U.S. Pat. No. 3,969,118, copying layers are described which undergo a change of color upon exposure and in which the photosensitive components comprise an o-naphthoquinone diazide-4-sulfonic acid halide, which together with a suitable dye results in a clearly visible and lasting image contrast after exposure to actinic light as well as after development. It is, however, disadvantageous that printing stencils exposed to light after development, which were prepared of printing plates composed of a copying layer of the above-mentioned composition and of certain supports, such as wire-brushed aluminum, result in shorter runs than are obtained with a copying layer which was produced under comparable standard conditions and which does not contain the mentioned additive yielding an image contrast.

It is, therefore, an object of the present invention to provide a light-sensitive copying layer of the above-described kind for the production, e.g., of printing plates, conductor images, screen printing stencils or resists, which layer does not have the disadvantages mentioned and which after exposure under an original, exhibits a reproduction of the original which is richer in contrast than with conventional copying materials of similar kind and, after development with alkaline solutions, remains rich in contrast.

The invention is based on a photosensitive composition comprising an ester or an amide of an o-naphthoquinone diazide sulfonic or carboxylic acid and, based upon the amount of this compound, 1 to 50 percent by weight of an organic dye capable of salt formation, and 5 to 75 percent by weight of a photosensitive halogen-containing compound which releases acid when exposed to light. The halogen-containing compound corresponds to one of the general formulae I or II:

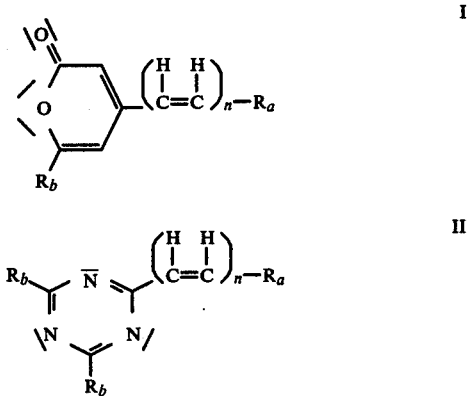

in which
$R_a$ is an aryl group or a heterocyclic group which may be substituted,
$R_b$ is a trihaloalkyl group or a trihaloalkenyl group having from 1 to 3 carbon atoms, and
n is 1, 2 or 3.

In a preferred embodiment, the composition contains 10 to 40 percent by weight of the halogen-containing compound and 3 to 30 percent by weight of the dye, based upon the weight of the naphthoquinone diazide compound.

It may be assumed that the photosensitive acid-releasing, halogen-containing compound present in the photosensitive composition according to the invention is photolytically split upon exposure to light and reacts in a subsequent reaction with the dye to effect a change of color so that, after exposure to actinic light, a marked contrast between the exposed and unexposed image areas is obtained. Further, the colored areas not struck by light are resistant to the developer to be used so that even after development a colored reproduction of the original with a strong contrast is maintained.

According to the invention, compounds in particular corresponding to formulae I and II are suitable which have in their molecules at least one photolytically cleavable halogen-carbon bond, preferably in trihalomethyl or trihalopropenyl groups. Particularly suitable are trihalomethyl-2-pyrones and symmetrical trihalomethyl triazines, which additionally have a chromophoric group conjugated with the pyrone or triazine ring system via olefinic double bonds. In addition to the compounds mentioned in the examples the following compounds are, e.g. also suitable:
4-(4-methoxy-styryl)-6-(3,3,3-trichloropropenyl)-2-pyrone and 4-(3,4,5-trimethoxy-styryl)-6-trichloromethyl-2-pyrone.

Some of these compounds are known as photoinitiators for polymerizable and cross-linkable compositions.

They are, e.g., described in U.S. Pat. Nos. 3,954,475, and 3,987,037 (vinyl halomethyl-s-triazines substituted by a chromophoric group). It is, however, new and surprising to find that upon irradiation with actinic light of wavelengths ranging from about 300 to 770 nm these compounds react with a suitable dye in a copying layer of the invention to effect a change of color.

In the particularly preferred compounds n is 1, $R_a$ is an N,N-dialkyl-amino-phenyl group or a dialkoxyphenyl group, and $R_b$ is a trichloromethyl or tribromomethyl group, i.e. they are substituted styryl pyrones or styryl triazines.

Suitable dyes for use in the invention are, among others, especially basic dyes from the group of triphenyl methanes, i.e. dyes which are derived from triphenyl-methane by substitution of the phenyl group by $NH_2$ groups, OH groups, $HSO_3$ groups or other groups or atoms, or from the group of azines, e.g. phenazines, oxazines or dyes from the group of the anthraquinones, i.e. dyes which are derived from anthraquinone, with the chromophoric groups being

and

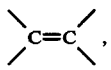

for example, Crystal Violet (42,555), Methyl Violet 2 B (42,535), Malachite Green (42,000), fuchsine (42,510), Crystal Violet carbinol base (42,555:1), parafuchsine (42,500), Sudan Blue G (61,520), Acilan Brilliant Blue 5 B (42,740), Acilan Violet S 4 BN (42,640), Astradiamond Green GX (42,040), Rhodamine B (45,170), Samaron Blue GSL (62,500), Victoria Blue B (44,045), Alizarine Direct Blue (65,055), Victoria Pure Blue BOD (42,595), Brilliant Green (42,040), Nile Blue BX (51,185), Neutral Red (50,040) and Rhoduline Pure Blue 3 G (51,004).

The numbers in brackets mean the C.I. constitution number used in the five-volume work "Colour Index", 3rd edition (1971, London) for identifying the dyes. The desired imagewise color contrast of the exposed layer is most distinct when the dye contained therein is red, blue or green. Such dyes are, therefore, preferably used.

The photosensitive substance contained in the copying layers is composed of one or several of the above-mentioned quinone diazide compounds. The preparation of these compounds is e.g., described in German Pat. Nos. 854,890; 865,109; 879,203; 894,959; 938,233; 1,109,521; 1,114,705; 1,118,606; 1,120,273; 1,124,817, and 1,543,721.

The copying layers of the invention may contain the conventional additives, e.g., resins and plasticizers, usually present in light-sensitive layers. The resin content may be considerable and may amount, for example, to several hundred percent of the total content of the o-naphthoquinone diazide compounds. Generally, resins are preferred which are soluble in aqueous-alkaline solutions, in particular novolaks.

As copying layer supports there may be used those which are conventional for the reproduction methods involved, e.g. metal plates or foils such as aluminum or zinc, with correspondingly pretreated surfaces; multimetal plates; e.g. chromium/copper, chromium/copper/aluminum, chromium/copper/zinc; or paper, plastic films, fabrics suitable for screen printing, or metallized plates of insulating material.

The composition of the invention makes it possible to maintain in the positive-working copying layers, which have proven their reliability for years, by exposure to light a distinct color change in the exposed areas, although the copying layer has a full inherent color due to the dye contained therein, and thus to obtain an image rich in contrast which, even under yellow illumination, distinctly contrasts with the unexposed areas.

Even after removal of the exposed parts with an alkaline developer, a stencil rich in contrast is formed which corresponds to the original. Film edges and register marks also copied which normally must be removed or corrected after development thus become more distinctly visible. There is thus no need to dye copied film edges to make them more readily visible.

A further advantage of the copying layers prepared according to the invention is their excellent shelf life even under extreme, e.g. tropical conditions, as well as the consistency of runs even when printing stencils are used which may have been exposed to light after development. The halogen-containing compounds used as intended in the invention, which release acid when exposed to light are relatively stable compounds, as is shown by their classification in dangerous-materials class III (inflammable materials) of Annex C of "Eisenbahnverkehrsordnung" (Railway Traffic Regulations of Deutsche Bundesbahn), and they have, therefore, a wider range of application than some of the compounds hitherto used for that purpose.

The invention will be further illustrated by reference to the following examples in which one part by volume is 1 ml when one part by weight is 1 g.

EXAMPLE 1

0.80 part by weight of the esterification product of 1 mole of 2,4-dihydroxy-benzophenone and 2 moles of the chloride of naphthoquinone-(1,2)-diazide-(2)-5-sulfonic acid, 0.85 part by weight of the esterification product of 1 mole of 2,2′-dihydroxy-dinaphthyl-(1,1′)-methane and 2 moles of the chloride of naphthoquinone-(1,2)-diazide-(2)-5-sulfonic acid, 4.80 parts by weight of a phenol-formaldehyde novolak (content of OH groups: 14 percent by weight) (softening range according to the capillary method, DIN 53,181: 110° to 120° C.), 0.23 part by weight of polyvinyl butyral, 0.17 part by weight of Crystal Violet (C.I. No. 42,555), 0.55 part by weight of 2,4-bis-(trichloromethyl)-6-p-methoxystyryl-s-triazine, and 0.50 part by weight of phosphoric acid tri-(β-chloroethyl)-ester are dissolved in a solvent mixture composed of:

80 parts by volume of ethylene glycol monomethyl ether and 15 parts by volume of butyl acetate.

An aluminum foil roughened by brushing is coated with this solution.

The photosensitive printing plate thus obtained has a blue colored copying layer. After its exposure to light under a diapositive, the unexposed areas of the layer remain blue colored, whereas the exposed areas of the layer are only faintly colored or almost colorless. The image of the original thus can be seen with such a good contrast that it can be distinctly recognized in all details even in yellow light.

For the production of a printing form, the exposed printing plate is developed in the usual manner with a solution of:

5.3 parts by weight of sodium metasilicate 0.9 $H_2O$
3.4 parts by weight of sodium orthophosphate 0.12 $H_2O$
0.3 part by weight of sodium dihydrogen phosphate (anhydrous) in
91 parts by volume of water, so that the exposed layer areas are removed. The remaining unexposed layer areas remain visible with a good contrast with respect to the colorless background.

The procedure in the following Examples 2 to 5 is similar to that in the above Example 1 and, after exposure of the obtained photosensitive printing plates, similar results are obtained with respect to image contrast prior to and also after development. In the following examples, therefore, in most cases only the ingredients of the coating solutions and the kind of support used are indicated, and only occasionally additional brief remarks are added.

EXAMPLE 2

Coating solution 0.86 part by weight of the esterification product of 1 mole of 2,3,4-trihydroxy-benzophenone and 3 moles of the chloride of naphthoquinone-(1,2)-diazide-(2)-5-sulfonic acid,
0.70 part by weight of the esterification product of 1 mole of 2,2'-dihydroxy-dinaphthyl-(1,1')-methane and 2 moles of the chloride of naphthoquinone (1,2)-diazide-(2)-5-sulfonic acid,
7.20 parts by weight of a cresol-formaldehyde novolak (softening range according to the capillary method, DIN 53,181: 105° to 120° C.),
0.05 part by weight of Crystal Violet base (C.I. No. 42,555:1),
0.20 part by weight of 4-(2,4-dimethoxy-styryl)-6-trichloromethyl-2-pyrone,
36 parts by volume of ethylene glycol monomethyl ether,
47 parts by volume of tetrahydrofuran, and
8 parts by volume of butyl acetate.
Copying layer support: electrolytically roughened and anodized aluminum foil.

EXAMPLE 3

Coating solution 0.86 part by weight of the esterification product of 1 mole of 2,3,4-trihydroxy-benzophenone and 3 moles of the chloride of naphthoquinone-(1,2)-diazide-(2)-5-sulfonic acid,
0.70 part by weight of the esterification product of 1 mole of 2,2'-dihydroxy-dinaphthyl-(1,1')-methane and 2 moles of the chloride of naphthoquinone-(1,2)-diazide-(2)-5-sulfonic acid,
7.20 parts by weight of a novolak (as in Example 2),
0.05 part by weight of Crystal Violet base (C.I. No. 42,555:1),
0.20 part by weight of 4-(3,4-dioxymethylene-styryl)-6-trichloromethyl-2-pyrone,
36 parts by volume of ethylene glycol monomethyl ether,
47 parts by volume of tetrahydrofuran, and
8 parts by volume of butyl acetate.
Copying layer support: electrolytically roughened and anodized aluminum foil.

EXAMPLE 4

Coating solution 0.86 part by weight of the esterification product of 1 mole of 2,3,4-trihydroxy-benzophenone and 3 moles of the chloride of naphthoquinone-(1,2-diazide-(2)-5-sulfonic acid,
0.70 part by weight of the esterification product of 1 mole of 2,2'-dihydroxy-dinaphthyl-(1,1')methane and 2 moles of the chloride of naphthoquinone-(1,2)-diazide-(2)-5-sulfonic acid,
7.20 parts by weight of a cresol-formaldehyde novolak (as in Example 2),
0.05 part by weight of Crystal Violet (C.I. No. 42,555),
0.20 part by weight of 2,4-bis-(trichloromethyl)-6-p-dimethylamino-styryl-s-triazine, and
95 parts by volume of the solvent mixture as in Example 1.
Copying layer support: aluminum foil roughened by brushing.

EXAMPLE 5

This example describes a copying layer solution which may be used as a positive photoresist composition for various purposes, particularly for the preparation of etch resists, e.g., for etching shaped articles and signboards and in the production of conductor images, particularly also in microelectronics. The solution has a long shelf life. The type of coating and the layer thickness may be adapted within wide limits to the respective requirements. After exposure to light, the exposed areas appear in good contrast with respect to the unexposed areas. The exposed areas may be easily removed with an alkaline developer (pH about 12.8).

Coating solution 1.5 parts by weight of the esterification product of 1 mole of 2,3,4-trihydroxy-benzophenone and 2 moles of the chloride of naphthoquinone-(1,2)-diazide-(2)-5-sulfonic acid,
0.4 part by weight of 4-(4-dimethoxy-styryl)-6-trichloromethyl-2-pyrone,
0.1 part by weight of Crystal Violet (C.I. No. 42,555),
10.0 parts by weight of a phenol-formaldehyde novolak (as in Example 1),
2.0 parts by weight of epoxy resin (Epikote ® 1001),
40 parts by volume of ethylene glycol monomethyl ether,
50 parts by volume of tetrahydrofuran and
10 parts by volume of butyl acetate.
A plate of insulating material laminated with a copper foil of 35μ thickness (Kupfer-Pertinax®) is coated with this solution.

TABLE

Color changes on exposure of the copying layers according to the invention:

| Example | Color | |
| No. | Unexposed | Exposed |
| --- | --- | --- |
| 1 | blue | light green |
| 2 | green | light green |
| 3 | dark green | light blue-green |

| Example No. | Color Unexposed | Exposed |
|---|---|---|
| 4 | brown | light blue |
| 5 | dark green | light green |

It will be obvious to those skilled in the art that many modifications may be made within the scope of the present invention without departing from the spirit thereof, and the invention includes all such modifications.

What is claimed is:

1. A photosensitive composition comprising an ester or an amide of an o-naphthoquinone diazide sulfonic or carboxylic acid and, based on the amount of this compound, about 1 to 50 percent by weight of an organic dye capable of salt formation and selected from the group consisting of triphenylmethane, azine or anthraquinone dyes, and about 5 to 75 percent by weight of a photosensitive halogen-containing compound which releases acid upon exposure to light and having one of the general formulae I or II

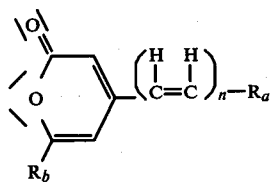

I

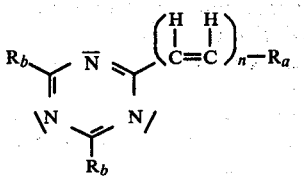

II in which
$R_a$ is an aryl group or a heterocyclic group which may be substituted,
$R_b$ is a trihaloalkyl group or a trihaloalkenyl group having from 1 to 3 carbon atoms and
n is 1, 2 or 3.

2. A photosensitive composition in accordance with claim 1 which comprises 10 to 40 percent by weight of the halogen-containing compound and 3 to 30 percent by weight of a dye, based on the weight of the naphthoquinone diazide compound.

3. A photosensitive composition in accordance with claim 1 in which the dye is red, blue or green.

4. A photosensitive composition in accordance with claim 1 in which in the general formulae I and II
$R_a$ is an N,N-dialkylamino-phenyl group or a dialkoxy-phenyl group,
$R_b$ is a trichloromethyl or tribromomethyl group, and
n is 1.

5. A photosensitive composition in accordance with claim 1 which further comprises a resin which is soluble or swellable in aqueous alkaline solutions.

6. A photosensitive composition in accordance with claim 5 in which the resin is a novolak.

* * * * *